United States Patent
Paci

(10) Patent No.: US 9,766,304 B2
(45) Date of Patent: Sep. 19, 2017

(54) INTEGRATED AMR MAGNETORESISTOR WITH A SET/RESET COIL HAVING A STRETCH POSITIONED BETWEEN A MAGNETORESISTIVE STRIP AND A CONCENTRATING REGION

(71) Applicant: STMICROELECTRONICS S.R.L., Agrate Brianza (IT)

(72) Inventor: Dario Paci, Sedrano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 265 days.

(21) Appl. No.: 14/287,798

(22) Filed: May 27, 2014

(65) Prior Publication Data

US 2014/0353785 A1 Dec. 4, 2014

(30) Foreign Application Priority Data

May 29, 2013 (IT) .............................. TO2013A0436

(51) Int. Cl.
*G01R 33/09* (2006.01)
*G01R 33/00* (2006.01)
*H01L 27/22* (2006.01)
*H01L 43/02* (2006.01)

(52) U.S. Cl.
CPC ........ *G01R 33/096* (2013.01); *G01R 33/0011* (2013.01); *H01L 27/22* (2013.01); *H01L 43/02* (2013.01)

(58) Field of Classification Search
CPC .. G01R 33/07; G01R 33/0011; G01R 33/096; H01L 27/22; H01L 43/02

USPC .......................................................... 324/252
See application file for complete search history.

(56) References Cited

U.S. PATENT DOCUMENTS

| | | | | |
|---|---|---|---|---|
| 5,247,278 A | | 9/1993 | Pant et al. | |
| 5,287,237 A | * | 2/1994 | Kitada | B82Y 25/00 257/E43.004 |
| 5,351,005 A | * | 9/1994 | Rouse | G01R 17/10 324/207.21 |
| 5,583,726 A | * | 12/1996 | Mizoshita | G11B 5/02 360/319 |
| 5,894,385 A | * | 4/1999 | Gill | B82Y 10/00 360/321 |
| 5,942,895 A | * | 8/1999 | Popovic | G01R 1/07 324/117 H |

(Continued)

OTHER PUBLICATIONS

Tumanski, S., "Thin Film Magnetoresistive Sensors," IOP Publishing Ltd, 2001, pp. 1-163.

(Continued)

*Primary Examiner* — Jay Patidar
(74) *Attorney, Agent, or Firm* — Seed IP Law Group LLP

(57) ABSTRACT

An integrated magnetoresistive sensor of an AMR (Anisotropic Magneto Resistance) type, formed by a magnetoresistive strip of ferromagnetic material and having an elongated shape with a preferential magnetization direction. A set/reset coil has a stretch, which extends over and transversely to the magnetoresistive strip. A concentrating region, also of ferromagnetic material, extends over the stretch of the set/reset coil so as to form a magnetic circuit for the field generated by the set/reset coil during steps of refresh and maintenance of magnetization of the magnetoresistive coil.

18 Claims, 6 Drawing Sheets

(56) References Cited

U.S. PATENT DOCUMENTS

| | | | | |
|---|---|---|---|---|
| 6,310,470 B1* | 10/2001 | Hebing | ................ | G01R 15/205 |
| | | | | 324/117 R |
| 6,346,183 B1* | 2/2002 | Baer | ....................... | G03F 7/091 |
| | | | | 204/192.2 |
| 6,529,114 B1* | 3/2003 | Bohlinger | ............ | G01R 33/096 |
| | | | | 324/252 |
| 7,235,968 B2* | 6/2007 | Popovic | ............... | G01R 33/077 |
| | | | | 324/247 |
| 2002/0167766 A1* | 11/2002 | Hayashi | ................ | B82Y 25/00 |
| | | | | 360/324.2 |
| 2004/0047073 A1* | 3/2004 | Kasajima | ............... | G11B 5/313 |
| | | | | 360/123.19 |
| 2006/0092563 A1* | 5/2006 | Le | .......................... | G11B 5/133 |
| | | | | 360/125.01 |
| 2007/0121249 A1* | 5/2007 | Parker | .................... | G01R 33/04 |
| | | | | 360/123.1 |
| 2013/0265039 A1* | 10/2013 | Cai | ...................... | G01R 33/098 |
| | | | | 324/252 |
| 2013/0300402 A1* | 11/2013 | Liu | ....................... | G01R 33/09 |
| | | | | 324/202 |

OTHER PUBLICATIONS

Italian Search Report and Written Opinion dated Jan. 28, 2014 from corresponding Italian Application No. TO2013A000436.
RCAZ, Robert, "Electronic Compass Sensor", *Proceedings of IEEE sensors 2004*, pp. 1446-1449, Oct. 24, 2004.

\* cited by examiner

INTEGRATED AMR MAGNETORESISTOR WITH A SET/RESET COIL HAVING A STRETCH POSITIONED BETWEEN A MAGNETORESISTIVE STRIP AND A CONCENTRATING REGION

CROSS REFERENCE TO RELATED APPLICATIONS

This application claims the priority benefit of Italian Patent Application No. TO2013A000436, filed May 29, 2013, and which application is hereby incorporated by reference to the maximum extent allowable by law.

BACKGROUND

Technical Field

The present disclosure relates to a low-consumption integrated magnetoresistor of an AMR (Anisotropic MagnetoResistance) type.

Discussion of the Related Art

Magnetic-field AMR sensors are used in a plurality of applications and systems, for example in compasses, in systems for detecting ferromagnetic characteristics, in the detection of currents, and in a wide range of other applications, by virtue of their capacity of detecting natural magnetic fields (for example, the Earth's magnetic field) and magnetic fields generated by electrical components (such as electrical or electronic devices and lines run by electric current).

As is known, the above magnetoresistive sensors exploit the capacity by appropriate ferromagnetic materials (referred to as "magnetoresistive materials", for example the material known by the name of "permalloy" constituted by a Fe—Ni alloy) of modifying their own resistance in presence of an external magnetic field.

Currently, integrated magnetoresistive sensors are provided as strips of magnetoresistive material on a substrate of semiconductor material, for example silicon. During manufacture, the strip of magnetoresistive material is magnetized so as to have a preferential magnetization in a preset direction, for example the longitudinal direction of the strip.

In absence of external magnetic fields, the magnetization maintains the imposed direction, and the strip has maximum resistance. In presence of external magnetic fields having a direction different from that of preferential magnetization, the magnetization of the strip changes, as does its resistance, which decreases, as illustrated in FIGS. 1A and 1B.

In FIG. 1A, which shows the magnetization M in absence of an external magnetic field, a magnetoresistor 1 is formed by a magnetoresistive strip 2 having a longitudinal direction parallel to axis X (referred to as also "easy axis", since this direction is the easiest strip magnetization direction). The magnetoresistor 1 is supplied with a current I flowing in the longitudinal direction of the strip. In this condition, the magnetization M is parallel to the easy axis EA.

In FIG. 1B, the magnetoresistor 1 is immersed in an external magnetic field Hy parallel to the axis Y (also referred to as "hard axis" since it is the direction in which magnetization of the magnetoresistive strip 2 is more difficult). In this condition, the external magnetic field Hy causes a rotation of the magnetization M by an angle α with respect to the current I, causing a reduction of the resistance of the magnetoresistive strip 2 according to a law correlated to $\cos^2 \alpha$.

To linearize the plot of the resistance R at least in an operating portion of the curve, it is known to form, on the magnetoresistive strip 2, transverse strips 3 (referred to as "barber poles"), of conductive material (for example, aluminium), arranged at a constant pitch and with an inclination of 45° with respect to the direction of the easy axis EA, as illustrated in FIG. 2.

In this situation, the direction of the current I changes, but not the magnetization M (the direction of which still depends upon the external magnetic field), and the resistance has a linear characteristic around the zero point of the external magnetic field. In this way, any possible magnetic fields directed along or having a component parallel to axis Y can be easily detected.

FIG. 3 shows a magnetoresistive sensor 4 including four magnetoresistors 1 of the type illustrated in FIG. 2, connected to form a Wheatstone bridge, with the transverse strips 3 arranged in an alternating way in each branch 4a and 4b of the Wheatstone bridge. The two branches 4a, 4b are connected at two input nodes 5, 6 across which a biasing voltage Vb is applied. In this way, the output voltage Vo existing between the intermediate nodes 7, 8 of the branches 4a, 4b is correlated to the existing external magnetic field Hy.

The above magnetoresistive sensors work properly provided that each magnetoresistor 1 is magnetized in the direction of the easy axis in absence of external magnetic fields and as long as the imposed magnetization M persists.

To maintain the imposed magnetization M, magnetoresistive sensors generally comprise a set/reset coil (designated by 10 in FIG. 4). The set/reset coil 10 enables execution of refresh operations, including repeated rapid magnetization steps in the desired direction. As may be noted from FIGS. 4 and 5, the set/reset coil 10, here in the shape of a square spiral, has stretches 11 that extend in a transverse direction, preferably perpendicular, to the longitudinal direction of the magnetoresistive strip 2, parallel to the easy axis EA. In the example illustrated, see in particular the cross-section of FIG. 5, the set/reset coil 10 is formed in a third metallization level M3, over the magnetoresistive strip 2. In turn, the magnetoresistive strip 2 is formed underneath a first magnetization level M1 and the latter forms the barber poles 3. The described structure is formed in an insulation structure 12 overlying a substrate 13, for example of silicon and forming with the latter an integrated chip 15.

In practice, during the refresh operations, the set/reset coil 10 is supplied with a current of a high value and generates a magnetic field B that, at the magnetoresistive strip 2, is parallel to the direction of the easy axis (see, for example, the document No. U.S. Pat. No. 5,247,278).

However, the refresh operation calls for high currents for the set/reset operations and thus involves a high consumption of the magnetoresistor 1. The consumption can be reduced by reducing the duration of the set/reset pulse, for example providing pulses having a duration of a few microseconds, repeated every 1-100 milliseconds. However, miniaturization of devices and integration of an ever-increasing number of functions in portable devices require a further reduction of the power consumption levels so that the reduction of duration of the set/reset pulses down to the values indicated above is not always sufficient.

Moreover, the high value of the set/reset currents is not easy to obtain. In fact, for this purpose, the driving circuit (generally provided as ASIC—Application-Specific Integrated Circuit) requires the presence of power MOS transistors that are able to carry the required high currents, with consequent increase in the overall dimensions and costs. In addition, the circuitry for generating the pulses requires the presence of an external capacitor. However, these requirements clash with the desire of scaling for small packaged sensors of reduced dimensions (e.g., 1.5×1.5 mm$^2$). Manufacture of the capacitor as an external component on the application board involves further costs and implementation difficulties. Another problem linked to the presence of high pulses in the device resides in that these pulses may capacitively couple to the digital part, driving spurious resets thereon, with undesirable effects on operation of the device.

Another problem in known magnetoresistors lies in that, if they are immersed in a high stray field having the same direction as magnetization, and thus opposite direction as the field generated by the set/reset coil, the initial set/reset condition may be cancelled out, causing errors in the measurements. This problem involves a reduction of the maximum magnetic field that can be detected by the magnetoresistor. This reduction is particularly undesirable in the case of magnetoresistive sensors mounted in cellphones and other mobile devices, operating in environments where increasingly strong stray magnetic fields are present.

SUMMARY

According to an embodiment, there is provided an integrated magnetoresistive sensor of an AMR (Anisotropic Magneto Resistance) type, comprising a magnetoresistor including a magnetoresistive strip with an elongated shape and having a preferential magnetization direction; a set/reset coil having a stretch extending transversely to the magnetoresistive strip; and a concentrating region of ferromagnetic material, wherein the magnetoresistive strip and the concentrating region extend over opposite sides of the stretch of the set/reset coil.

According to another embodiment, the concentrating region is of soft ferromagnetic material, such as permalloy or other material including cobalt-iron-boron or permalloy, or of hard magnetic material.

According to another embodiment, the concentrating region has an elongated shape, parallel to the magnetoresistive strip.

According to another embodiment, the magneto resistive sensor comprises a pair of magnetic vias extending between end portions of the magnetoresistive strip and of the concentrating region and laterally surrounding the stretch of the set/reset coil, the magnetoresistive strip, the concentrating region, and the magnetic vias forming a closed magnetic circuit.

According to another embodiment, the magneto resistive sensor is formed in an insulating region on a semiconductor material substrate, wherein the stretch of the set/reset coil extends over the magnetoresistive strip, and the concentrating region extends over the stretch of the set/reset coil.

According to another embodiment, the concentrating region comprises a plurality of concentration strips extending over the magnetoresistive strip, parallel to each other and to the magnetoresistive strip.

According to another embodiment, two pairs of magnetoresistors according to claim 1, each magnetoresistor comprising at least one respective magnetoresistive strip; two pairs of concentrating regions, each concentrating region extending over or underneath a respective magnetoresistive strip; and a single set/reset coil arranged vertically between the pairs of magnetoresistors and the respective concentrating regions.

According to another embodiment, the magnetoresistive strips of the pairs of magnetoresistors are coplanar, extend parallel to each other and are connected in bridge configuration; and the set/reset coil has a first and a second stretches, parallel to each other and extending transversely to the magnetoresistive strips and to the concentrating regions, the first stretch of the set/reset coil extending vertically between the magnetoresistive strips and the respective concentrating regions of a first pair of magnetoresistors, and the second stretch of the set/reset coil extending vertically between the magnetoresistive strips and the respective concentrating regions of a second pair of magnetoresistors.

In practice, a structure for an AMR magnetoresistive sensor is provided, based upon the presence of a magnetic-field concentration layer, arranged on an opposite side of the set/reset coil with respect to the magnetoresistor and concentrating the lines of magnetic flux generated by the set/reset coil to increase the amplitude of the magnetic field acting on the magnetoresistor during a refresh operation and thus magnetization of the magnetoresistor during read operations.

BRIEF DESCRIPTION OF THE DRAWINGS

For a better understanding of the present disclosure, embodiments thereof are now described, purely by way of non-limiting example, with reference to the attached drawings, wherein.

DETAILED DESCRIPTION

A first embodiment of the present application is an integrated magnetoresistive sensor of an AMR (Anisotropic Magneto Resistance) type, include:

a magnetoresistor including a magnetoresistive strip with an elongated shape and having a preferential magnetization direction;

a set/reset coil having a stretch extending transversely to the magnetoresistive strip; and a concentrating region of ferromagnetic material, wherein the magnetoresistive strip and the concentrating region extend over opposite sides of the stretch of the set/reset coil.

A second embodiment of the present application is an integrated sensor of an AMR type, including:

two pairs of magnetoresistors according to the first embodiment, each magnetoresistor comprising at least one respective magnetoresistive strip;

two pairs of concentrating regions, each concentrating region extending over or underneath a respective magnetoresistive strip; and a single set/reset coil arranged vertically between the pairs of magnetoresistors and the respective concentrating regions.

Figure 6:
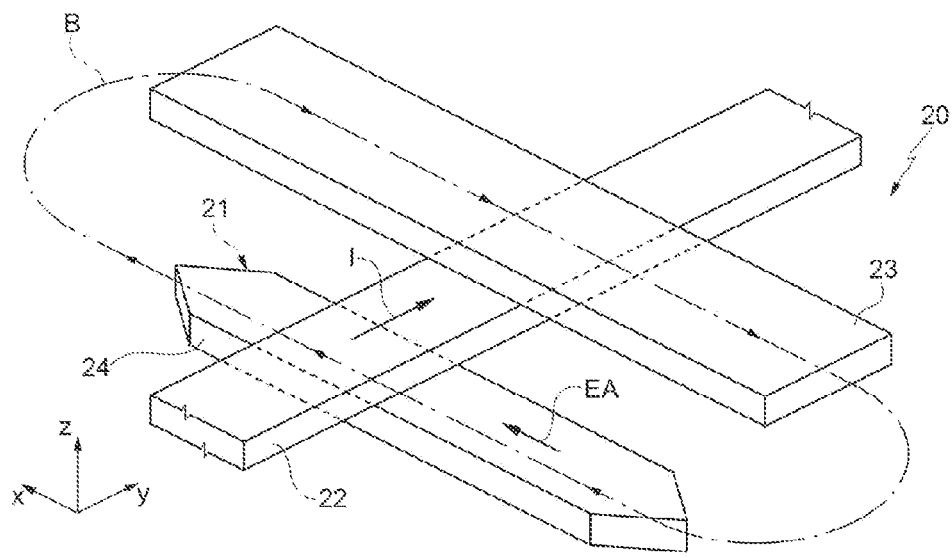
FIG. 6 is a perspective view of a detail of the present magnetoresistive sensor.

FIG. 6 is a schematic illustration of a portion of one embodiment of the present magnetoresistive sensor.

In detail, the magnetoresistive sensor of FIG. 6, designated by 20, comprises a magnetoresistor 21, a set/reset coil 22, and a concentrating region 23, which are arranged in a stack. In turn, the magnetoresistor 21 comprises a magnetoresistive strip 24 having an elongated shape in the direction of the easy axis EA, and barber poles (here not shown). In particular, the magnetoresistive strip 21 is made of magnetoresistive material, such as, for example, permalloy (a ferromagnetic alloy containing iron and nickel) and has a shape elongated in the direction of the easy axis EA. The set/reset coil 22, of conductive material, such as aluminium, is arranged between the magnetoresistive strip 21 and the concentrating region 23 and has at least one portion (portion represented) that extends in a second transverse direction, in particular perpendicular to the magnetoresistive strip 21. The concentrating region 23 is of ferromagnetic material, for example soft ferromagnetic, in particular isotropic, material such as permalloy or other material including cobalt-iron (such as cobalt-iron-silicon-boron (CoFeSiB) or cobalt-iron-silicon-molybdenum or -niobium), such as to have a coercivity Hc close to zero (and thus having a high concentrating effect) and permeability as high as possible (and thus having a high shielding effect). Alternatively, it is possible to use a hard magnetic material that is able to maintain magnetization. In this case, the concentrating region 23 could be magnetized only very rarely with a very high current and could use the permanent magnetization obtained for magnetizing the magnetoresistive strip 21.

In the embodiment illustrated, the concentrating region 23 extends over the magnetoresistive strip 21 and the set/reset coil 22 and has a shape elongated in the same direction as the easy axis EA.

By virtue of the concentrating region 23, arranged vertically above or underneath the magnetoresistive strip 21 and with the set/reset coil arranged between them, during the set/reset step, when the set/reset coil 22 is supplied with a current I, it generates a magnetic field B that is concentrated in the magnetoresistive strip 21 and in the concentrating region 23. In this way, the concentrating region 23 concurs, together with the magnetoresistive strip 21, in gathering and concentrating the lines of flux of the magnetic field B, thus determining an increase in the amplitude of the magnetic field B guided on the magnetoresistive strip 21 as compared to a magnetoresistive sensor not provided with the concentrating region 23.

Moreover, in operating conditions, i.e., during detection of external magnetic fields, the concentrating region 23 forms a shield for the magnetoresistive strip 21 against stray magnetic fields in the direction of the easy axis EA, without affecting the sensitivity of the magnetoresistive sensor 20 in the sensitivity direction, perpendicular to the easy axis EA.

To increase the gathering and concentration of the lines of flux of the magnetic field generated by the set/reset coil 22 during the refresh step, according to a further aspect, the concentrating region 23, in addition to being elongated in a direction parallel to the easy axis, has a high length-to-width aspect ratio. For instance, the length-to-width ratio of the concentrating region 23 may be at least 5:1 (in other words, the length of the concentrating region 23, in a direction parallel to the axis X, is at least five times greater than its width, in a direction parallel to the axis Y). For instance, in the case of concentrating regions 23 with a width of 30 μm, they can have a length of at least 200 μm. The presence of one or more concentrating regions 23 aligned in the direction of the easy axis of the magnetoresistor 21 enables a further increase of the shielding effect of the latter against external magnetic fields directed along the axis perpendicular to the easy axis EA.

According to another aspect, the width of the concentrating region 23 (in a perpendicular direction to the easy axis EA) is smaller than that of the magnetoresistive strip 24, and, if the technological process so enables, it is possible to define two or more concentrating regions 23 over the magnetoresistor 21.

Figure 1A:
FIGS. 1A and 1B are schematic illustrations of a known magnetoresistor of an AMR type in absence and, respectively, presence of an external magnetic field.
Figure 1B:
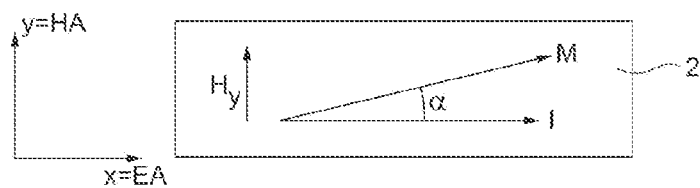
Figure 2:
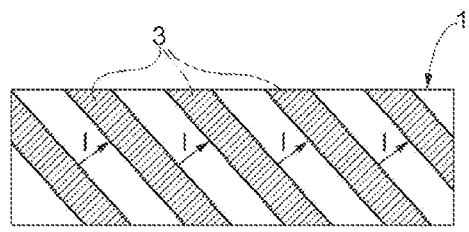
FIG. 2 is a schematic illustration of an embodiment of a known AMR magnetoresistor provided with barber poles.
Figure 3:
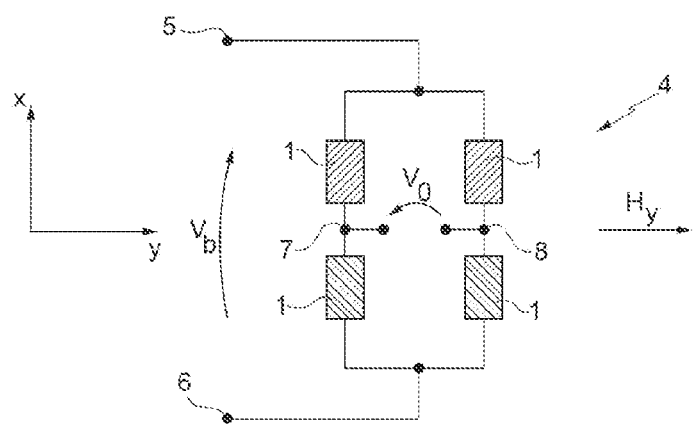
FIG. 3 shows a magnetoresistive sensor in bridge configuration formed by magnetoresistors of the type illustrated in FIG. 2.
Figure 4:
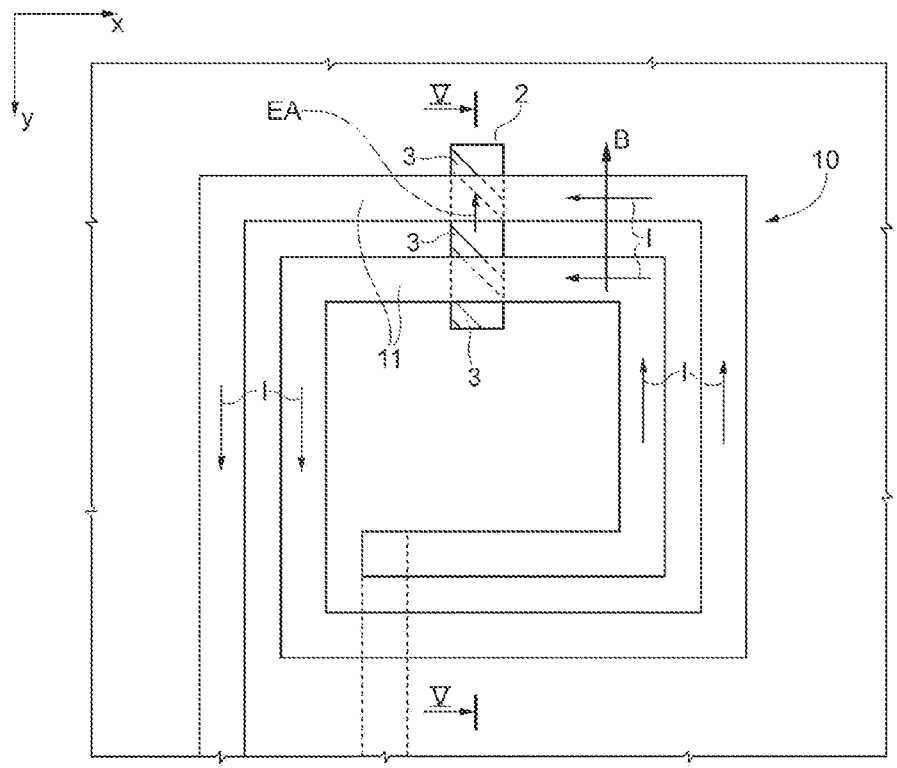
FIG. 4 is a schematic top plan view of a known magnetoresistive sensor provided with set/reset coil.
Figure 7:
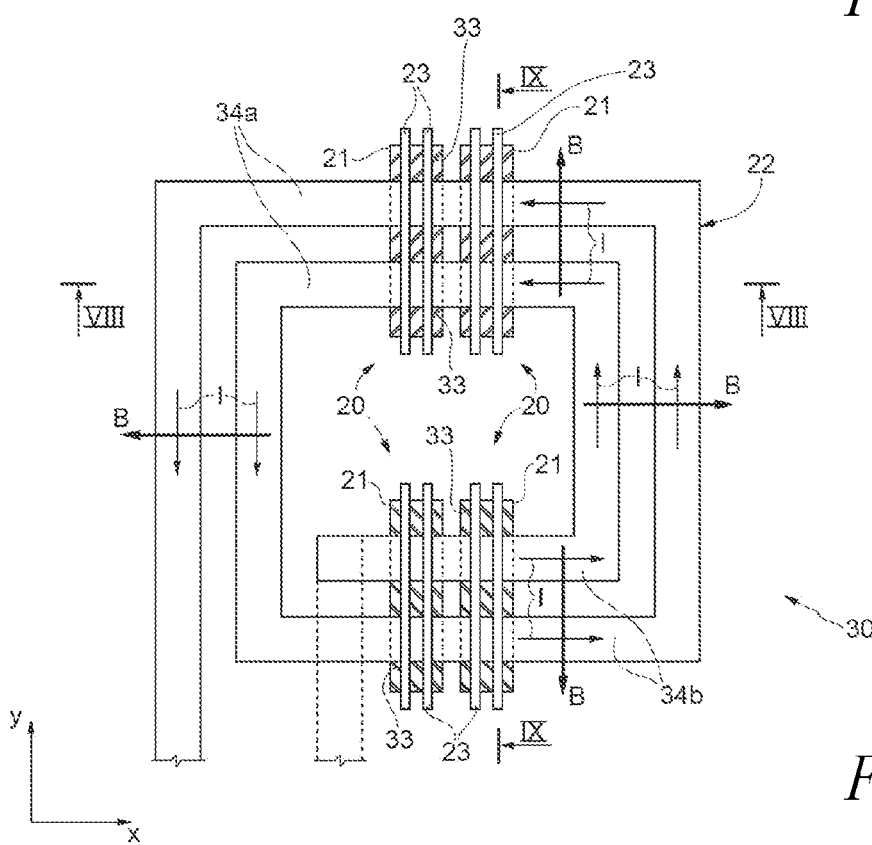
FIG. 7 is a top plan view of an embodiment of the present magnetoresistive sensor.
Figure 8:
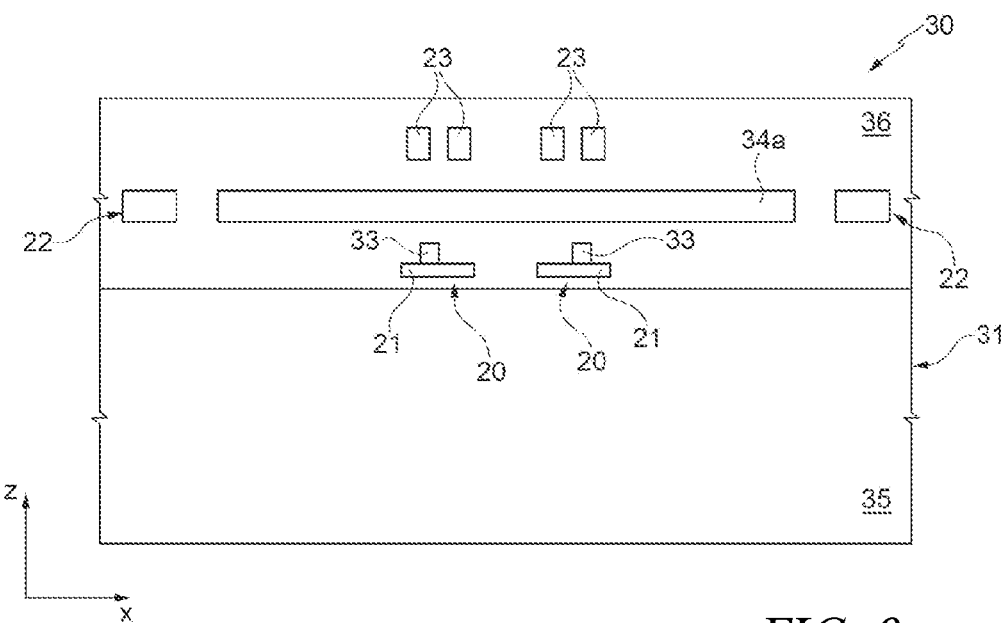
FIG. 8 is a cross-section of the present magnetoresistive sensor, taken along the section plane VIII-VIII of FIG. 7.
Figure 9:
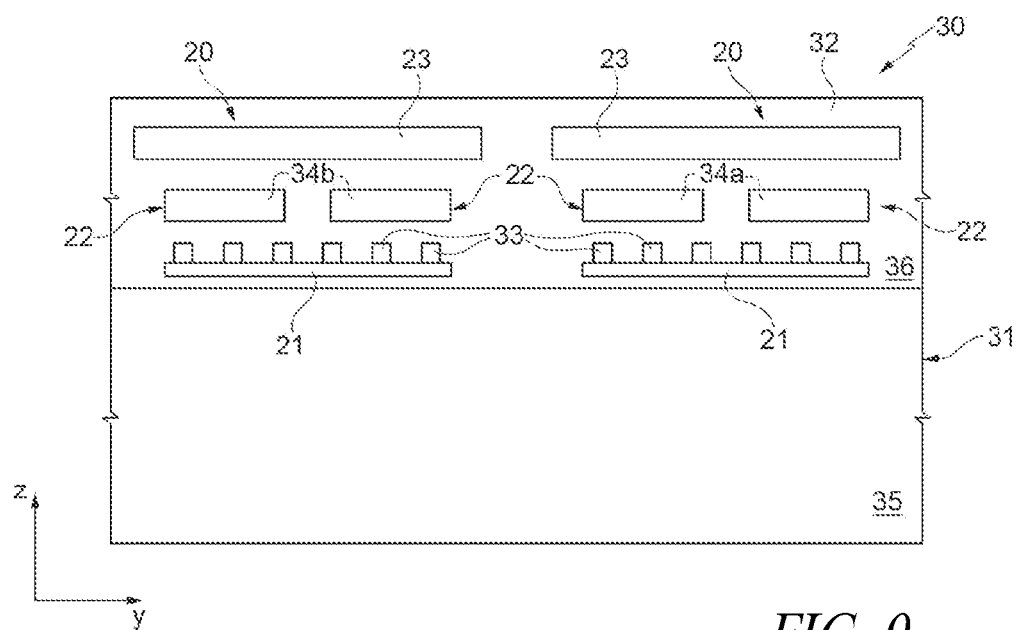
FIG. 9 is a cross-section taken along the section plane IX-IX of FIG. 7.

FIGS. 7, 8, and 9 show an embodiment of a magnetoresistive sensor 30 formed by four magnetoresistors 21, for example connected in bridge configuration as illustrated in FIG. 3.

In detail, in the example illustrated, the magnetoresistive strips 24 of the magnetoresistors 21 extend parallel to one another and to the axis Y, are coplanar to one another and arranged in pairs so that the magnetoresistive strips 24 of each pair are arranged alongside each other along the axis X, and the magnetoresistive strips 24 of one pair are aligned to the magnetoresistive strips 24 of the other pair, in a direction parallel to the axis Y. Moreover, the magnetoresistive strips 24 are here provided with barber poles 33 oriented symmetrically to axes X and Y.

The set/reset coil 22 has at least two mutually parallel stretches 34a, 34b (here, two pairs), each directed parallel to the axis X so that, in top plan view, each crosses a respective pair of magnetoresistive strips 24.

In turn, the concentrating regions 23 (here, two for each magnetoresistor 21) are directed parallel and vertically aligned to the respective magnetoresistive strips 21.

Figure 5:
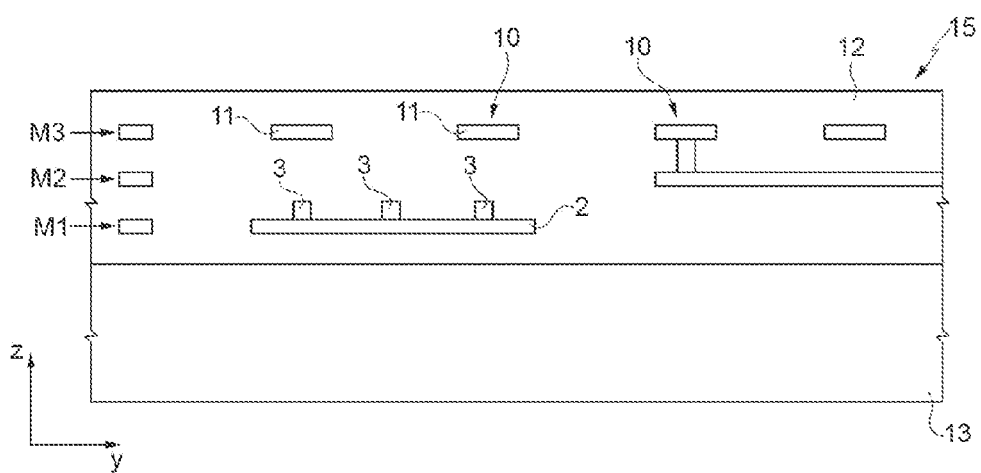
FIG. 5 is a cross-section, taken along cross-section line V-V, of the magnetoresistive sensor of FIG. 4.

As may be noted in particular in the sections of FIGS. 8 and 9, the magnetoresistors 21, the set/reset coil 22, and the concentrating regions 23 are formed in a die 31 having a substrate 35 and an insulating layer 36 overlying the substrate 35. Here, the magnetoresistive strips 24 and corresponding barber poles 33 are formed over the substrate 35, the set/reset coil 22 is formed over the magnetoresistive strips 24 in one or more metallization levels (as illustrated in FIG. 5), and the concentrating regions 23 are arranged over the set/reset coil 22. However, if so preferred for the technological process or for other reasons, the magnetoresistive strips 24 may be provided over the set/reset coil 22, and the concentrating regions 23 may be provided underneath the set/reset coil 22.

Figure 10:
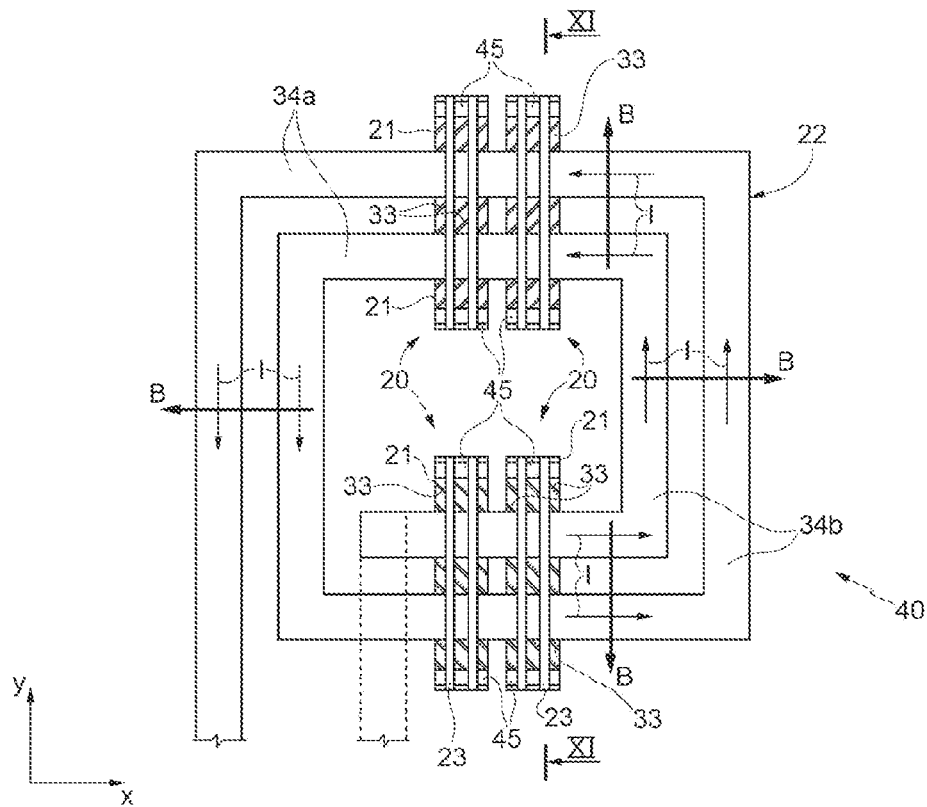
FIG. 10 is a top plan view of another embodiment of the present magnetoresistive sensor.
Figure 11:
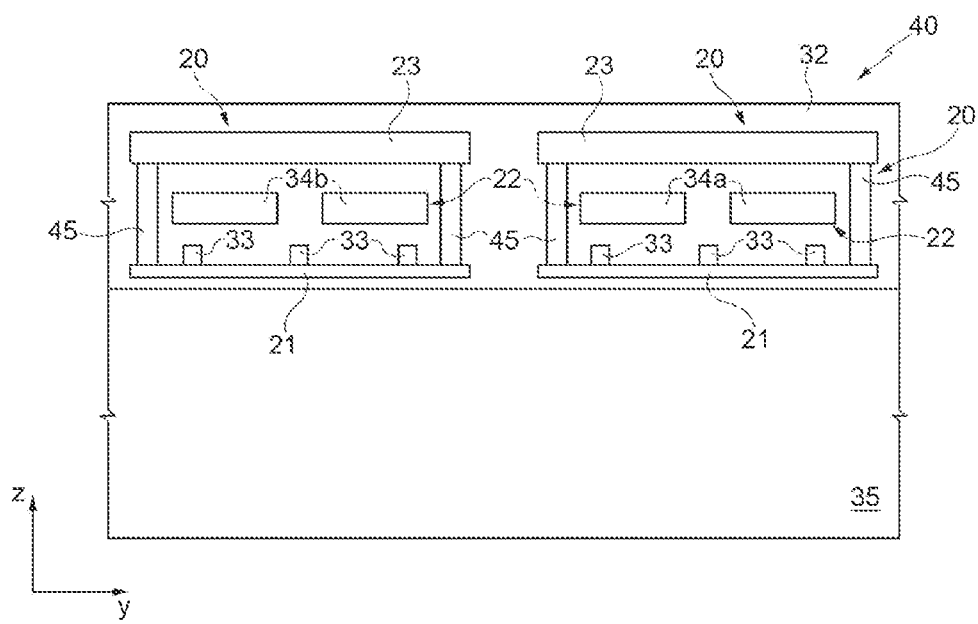
FIG. 11 is a cross-section of the present magnetoresistive sensor, taken along section plane XI-XI of FIG. 10.
Figure 12:
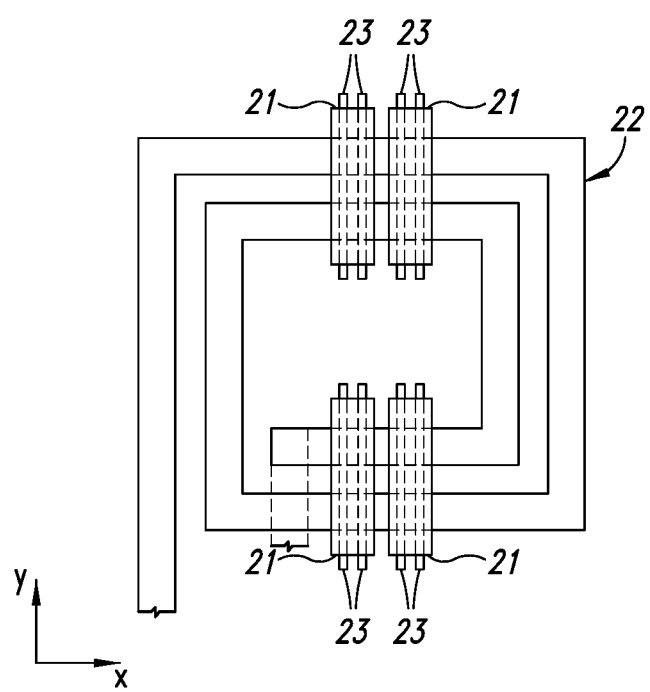
FIG. 12 is a top plan view of an embodiment of the present magnetoresistive sensor showing concentrating regions underneath magnetoresistive strips.

FIGS. 10 and 11 show an embodiment of a magnetoresistive sensor 40 having magnetic field closing elements. Here, the closing elements are formed by magnetic vias 45 that extend between the ends of the concentrating regions 23 and the ends of the respective magnetoresistive strips 24. Thus, each magnetoresistive strip 24 and the respective concentration region or regions 23 substantially have the same length and are connected by the magnetic vias 35 that extend vertically through the insulating region 36, thus forming a respective magnetic circuit that completely surrounds the stretches 34a or 34b of the set/reset coil 22 (see FIG. 11). Note that the magnetoresistive sensor 40 has a cross-section extending longitudinally with respect to the stretches 34*a*, 34*b* of the set/reset coil 22 that is the same as the cross-section illustrated in FIG. 8 for the magnetoresistive sensor 30.

With this solution, a closed path is obtained for the lines of flux of the magnetic field through the magnetic vias 35, which enables further reduction of the dispersion of the lines of flux in the air and maximization of the concentration of the magnetic field in the magnetoresistors 20. In this way, it is possible to obtain a further reduction of the current required for the set/reset operation.

Thereby the magnetoresistive sensor described has lower current consumption and/or smaller dimensions. In addition, it is able to shield stray magnetic fields in the magnetization direction, without reducing the sensitivity in the sensing direction.

Finally, it is clear that modifications and variations may be made to the magnetoresistive sensor described and illustrated herein, without thereby departing from the scope of the present invention, as defined in the attached claims.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated anisotropic magnetoresistance (AMR) magnetoresistive sensor, comprising:
   a magnetoresistor including a magnetoresistive strip with an elongated shape and having an easy axis and a magnetization direction parallel to the easy axis;
   a set/reset coil having a stretch extending transversely to the magnetoresistive strip; and
   a concentrating region of ferromagnetic material having an elongated shape and a length-to-width ratio of at least 5:1,
   wherein the concentrating region extends lengthwise parallel to a lengthwise dimension of the magnetoresistive strip and transversely with respect to a lengthwise dimension of the stretch of the set/reset coil, and
   wherein the magnetoresistive strip and the concentrating region extend over opposite sides of the stretch of the set/reset coil.

2. The magnetoresistive sensor according to claim 1, wherein the concentrating region is of soft ferromagnetic material.

3. The magnetoresistive sensor according to claim 1, further comprising a pair of magnetic vias extending between end portions of the magnetoresistive strip and of the concentrating region and laterally surrounding the stretch of the set/reset coil, the magnetoresistive strip, the concentrating region, and the magnetic vias forming a closed magnetic circuit.

4. The magnetoresistive sensor according to claim 1, further comprising:
   a semiconductor substrate;
   an insulating region on the semiconductor substrate, wherein magnetoresistive strip, set/reset coil, and concentrating region are positioned in the insulating region; the stretch of the set/reset coil extends directly over the magnetoresistive strip; and the concentrating region extends directly over the stretch of the set/reset coil.

5. The magnetoresistive sensor according to claim 1, wherein the concentrating region comprises a plurality of concentration strips extending directly over the magnetoresistive strip, parallel to each other and to the magnetoresistive strip.

6. The magnetoresistive sensor according to claim 1, wherein:
   the magnetoresistor is part of first and second pairs of magnetoresistors, each magnetoresistor including a respective magnetoresistive strip with an elongated shape and having an anisotropic magnetization direction;
   the concentrating region is part of two pairs of concentrating regions, each concentrating region extending over or underneath a respective one of the magnetoresistive strips; and
   the set/reset coil is arranged vertically between the pairs of magnetoresistors and the respective concentrating regions.

7. The magnetoresistive sensor according to claim 6, wherein:
   the magnetoresistive strips of the pairs of magnetoresistors are coplanar, extend parallel to each other and are connected in bridge configuration; and
   the set/reset coil has first and second stretches, parallel to each other and extending transversely to the magnetoresistive strips and to the concentrating regions, the first stretch of the set/reset coil extending vertically between the magnetoresistive strips and the respective concentrating regions of the first pair of magnetoresistors, and the second stretch of the set/reset coil extending vertically between the magnetoresistive strips and the respective concentrating regions of the second pair of magnetoresistors.

8. An integrated anisotropic magnetoresistance (AMR) sensor, comprising:
   first and second pairs of magnetoresistors, each magnetoresistor including a respective magnetoresistive strip with an elongated shape and having an anisotropic magnetization direction;
   two pairs of concentrating regions, each concentrating region extending over or underneath a respective one of the magnetoresistive strips; and
   a single set/reset coil arranged vertically between the pairs of magnetoresistors and the respective concentrating regions, wherein:
   the magnetoresistive strips of the pairs of magnetoresistors are coplanar, extend parallel to each other and are connected in bridge configuration; and
   the set/reset coil has first and second stretches, parallel to each other and extending transversely to the magnetoresistive strips and to the concentrating regions, the first stretch of the set/reset coil extending vertically between the magnetoresistive strips and the respective concentrating regions of the first pair of magnetoresistors, and the second stretch of the set/reset coil extending vertically between the magnetoresistive strips and the respective concentrating regions of the second pair of magnetoresistors.

9. The integrated sensor according to claim 8, further comprising a pair of magnetic vias extending between end portions of one of the magnetoresistive strips and of one of the concentrating regions and laterally surrounding the stretch of the set/reset coil, the one of the magnetoresistive strips, the one of the concentrating regions, and the magnetic vias forming a closed magnetic circuit.

10. The integrated sensor according to claim 8, further comprising:
    a semiconductor substrate; and an insulating region on the semiconductor substrate, wherein magnetoresistive strips, set/reset coil, and concentrating regions are positioned in the insulating region.

11. The integrated sensor according to claim 8, wherein each concentrating region comprises a plurality of concentration strips extending over a corresponding one of the magnetoresistive strips, parallel to each other and to the magnetoresistive strip.

12. An integrated anisotropic magnetoresistance (AMR) magnetoresistive sensor, comprising:
   a magnetoresistor including a magnetoresistive strip having an elongated shape, an easy axis, and a magnetization direction parallel to the easy axis;
   a set/reset coil having a stretch extending lengthwise transversely to a lengthwise dimension of the magnetoresistive strip; and
   a concentrating region of ferromagnetic material extending lengthwise transversely to the lengthwise dimension of the stretch,
   wherein the stretch of the set/reset coil extends between the magnetoresistive strip and the concentrating region, and
   wherein the concentrating region has a length-to-width ratio of at least 5:1.

13. The magnetoresistive sensor according to claim 12, wherein the concentrating region is of hard magnetic material.

14. The magnetoresistive sensor according to claim 12, further comprising a pair of magnetic vias extending between end portions of the magnetoresistive strip and of the concentrating region and laterally surrounding the stretch of the set/reset coil, the magnetoresistive strip, the concentrating region, and the magnetic vias forming a closed magnetic circuit.

15. The magnetoresistive sensor according to claim 12, further comprising:
   a semiconductor substrate;
   an insulating region on the semiconductor substrate, wherein magnetoresistive strip, set/reset coil, and concentrating region are positioned in the insulating region; the stretch of the set/reset coil extends over the magnetoresistive strip; and the concentrating region extends over the stretch of the set/reset coil.

16. The magnetoresistive sensor according to claim 12, wherein the concentrating region comprises a plurality of concentration strips extending over the magnetoresistive strip, parallel to each other and to the magnetoresistive strip.

17. The magnetoresistive sensor according to claim 12, wherein:
   the magnetoresistor is part of first and second pairs of magnetoresistors, each magnetoresistor including a respective magnetoresistive strip with an elongated shape and having an anisotropic magnetization direction;
   the concentrating region is part of two pairs of concentrating regions, each concentrating region extending over or underneath a respective one of the magnetoresistive strips; and
   the set/reset coil is arranged vertically between the pairs of magnetoresistors and the respective concentrating regions.

18. The magnetoresistive sensor according to claim 17, wherein:
   the magnetoresistive strips of the pairs of magnetoresistors are coplanar, extend parallel to each other and are connected in bridge configuration; and
   the set/reset coil has first and second stretches, parallel to each other and extending transversely to the magnetoresistive strips and to the concentrating regions, the first stretch of the set/reset coil extending vertically between the magnetoresistive strips and the respective concentrating regions of the first pair of magnetoresistors, and the second stretch of the set/reset coil extending vertically between the magnetoresistive strips and the respective concentrating regions of the second pair of magnetoresistors.

* * * * *